(12) United States Patent
Gonda

(10) Patent No.: US 8,137,898 B2
(45) Date of Patent: Mar. 20, 2012

(54) METHOD FOR MANUFACTURING SEMICONDUCTOR DEVICE

(75) Inventor: Toshiki Gonda, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 882 days.

(21) Appl. No.: 12/177,902

(22) Filed: Jul. 23, 2008

(65) Prior Publication Data

US 2009/0029294 A1    Jan. 29, 2009

(30) Foreign Application Priority Data

Jul. 23, 2007  (JP) ................. 2007-190455
Jul. 23, 2007  (JP) ................. 2007-190464

(51) Int. Cl.
*G03F 7/26* (2006.01)
(52) U.S. Cl. ...................... 430/312; 430/311
(58) Field of Classification Search ............... 430/5, 322
See application file for complete search history.

(56) References Cited

U.S. PATENT DOCUMENTS

| | | | |
|---|---|---|---|
| 5,936,707 A * | 8/1999 | Nguyen et al. ........... 355/18 |
| 2002/0007660 A1 | 1/2002 | Brown | |
| 2004/0142283 A1 * | 7/2004 | Inoue et al. ............. 430/311 |
| 2006/0017162 A1 * | 1/2006 | Seta et al. .............. 257/750 |
| 2006/0128054 A1 * | 6/2006 | Kim et al. .............. 438/82 |
| 2006/0267098 A1 * | 11/2006 | Fujimaki ................ 257/350 |
| 2007/0273858 A1 * | 11/2007 | Nagasaka ............... 355/67 |

FOREIGN PATENT DOCUMENTS

| | | |
|---|---|---|
| JP | 63-296221 | 12/1988 |
| JP | 4-346348 | 12/1992 |
| JP | 6-53159 | 2/1994 |
| JP | 2001-297997 | 10/2001 |

OTHER PUBLICATIONS

Japanese Official Action—2007-190455—Jan. 24, 2012.

* cited by examiner

*Primary Examiner* — Kathleen Duda
(74) *Attorney, Agent, or Firm* — Young & Thompson

(57) ABSTRACT

Disclosed is a method for manufacturing a semiconductor device. The method comprises: forming a resist layer over a substrate; exposing the resist layer to light thereby to form a first exposed pattern and a second exposed pattern on the resist layer, the second exposed pattern being used for forming one or more trenches; contacting the resist layer with a developing solution thereby to form a patterned resist having an opening corresponding to the first exposed pattern and to form one or more trenches corresponding to the second exposed pattern on a surface layer of the patterned resist; and conducting a bake process on the patterned resist.

19 Claims, 19 Drawing Sheets

METHOD FOR MANUFACTURING SEMICONDUCTOR DEVICE

This application is based on Japanese patent applications Nos. 2007-190455 and 2007-190464 which are incorporated herein by reference.

BACKGROUND

1. Technical Field

The present invention relates to a method for manufacturing a semiconductor device that provides prevention for thermal shrinkage of a patterned resist in a bake process.

2. Related Art

FIGS. 1A to 1D show cross-sectional views, illustrating a process for forming a typical conventional patterned resist. Here, a case of employing a positive resist is described as an example. In the process for forming a patterned resist, first of all, a resist is applied on a substrate 11 to form a resist layer 12 (FIG. 1A). Next, the resist layer 12 is exposed to light through a reticle 15 having a desired pattern arranged thereon to partially expose the resist layer to light. The exposed region of the resist layer 12 is removed by employing a liquid developer to form a patterned resist 18 (FIG. 1C).

Finally, a bake process is conducted on the patterned resist 18. The bake process exhibits advantageous effects such as prevention for pinhole in resists or polymer resin films such as polyimide film, an improved adhesiveness with substrates, a reduced degassing, an improved dry etch resistance and the like, and thus is generally broadly adopted. In addition, a thermal flow technology, in which a temperature of a resist in a bake process is optimized so as to plasticize a resin so that a pattern having a reduced dimension that is smaller than an estimated dimension of a developed pattern of holes is intentionally formed, is also employed mainly in processes for forming holes.

However, as shown in FIG. 1D, the patterned resist 18 may be often shrunk from an edge of the pattern toward the inside thereof by the bake process to be deformed. The level of the deformation in the patterned resist by such bake process tends to be further increased at higher baking temperature for thicker resist film and larger dimension of the pattern, and non-negligible deformations are increasingly occurred due to miniaturizations of the devices.

A specific example of employing the above-described patterned resist as a mask for ion implantation process will be described. FIGS. 2A to 2C are cross sectional views, illustrating an ideal process that exhibits no geometric change in a patterned resist due to a bake process.

When an ideal resist film is assumed, the patterned resist 18 maintains a rectangular geometry in an edge of the pattern after the bake process (FIG. 2A). An ion implantation is conducted through a mask of such patterned resist 18 (FIG. 2B). As a result, an injection is conducted at a desired injection level over a desired region of a substrate 11 to form an implanted region A28 as shown in FIG. 2C.

Besides, FIGS. 3A to 3C are cross sectional views, illustrating an example of an ion implanting process while a geometry change has been occurred in a patterned resist due to a bake process. As shown in FIG. 3A, a tapered geometry is formed in an edge of the pattern of the resist having larger dimensional area, and thus the resist film is partially thinned in the tapered section. Thus, when an ion implantation process is conducted through a mask of such patterned resist 18 (FIG. 3B), ion is also implanted over the section of the substrate corresponding to the thinned region of the resist film as shown in FIG. 3C. As a result, in addition to the targeted implant region A28, an unwillingly implanted region B29 is also formed, and thus it is expected that this leads to an electric failure in the semiconductor device.

A typical approach to prevent such deformation of the resist due to the bake process is described in Japanese Patent Laid-Open No. H06-53,159 (1994), in which a shrinkage-preventing pattern such as a bumpy or a saw tooth pattern is two-dimensionally formed in a resist and a presence of such bumpy or saw teeth pattern provides a prevention for a deformation in the patterned resist due to the bake process.

However, since the above-described conventional technology involves two-dimensionally forming an irregularity, it is necessary to form a two-dimensional pattern such as two-dimensional concave and convex geometry or saw teeth geometry in the implanted region. This leads to a complicated design, which is difficult to be applied to a fine pattern. In addition, it is also difficult to apply such technology to other processes such as an etching process and the like.

Here, typical deformation after a bake process for a resist employed as a mask for a dry etching process will specifically be described in reference to FIGS. 4A to 4C and FIGS. 5A to 5C.

FIGS. 4A to 4C illustrate a process for forming holes in an insulating film through a resist mask for dry etching. FIG. 4A is a plan view of a patterned resist 18 having openings 20 for forming holes, and FIG. 4B is an cross-sectional view along line A-A' in FIG. 4A. An insulating film 22 is deposited on a substrate 11 and a resist is applied, and then an exposure and a development processes are conducted on the resist layer to form a patterned resist 18 provided with openings 20. The insulating film 22 is dry etched through a mask of such patterned resist 18, and then the patterned resist 18 is removed to form the holes in the insulating film 22, as shown in FIG. 4A.

On the one hand, FIGS. 5A to 5C show the condition of the formation of openings 20 for forming holes having a reduced size by conducting a high-temperature bake process employing the thermal flow technology described above. FIG. 5A is a plan view of a patterned resist 18 after a high-temperature bake process is conducted, and FIG. 5B is a cross-sectional view along line B-B' in FIG. 5A. The amount of the resist is smaller in the section adjacent to the openings 20 where a fluidization of the resist is reduced, and thus a deformation of the resist is also smaller. However, other sections thereof are greatly deformed since other sections of the resist are shirred, resulting in forming different two-dimensional geometry and cross-sectional geometry of the opening 20 shown in FIGS. 5A and 5B, which are totally different from that shown in FIGS. 4A to 4C.

FIG. 5C shows a cross-sectional view, showing a status of the device, which is obtained by conducting an etch process through a mask of such patterned resist 18 and then the resist is removed. It can be understood that a center of the hole is shifted to the adjacent section. This means that a dislocation may be caused after the shrinkage when it is assumed that the dimension of hole is designed to be the equivalent to the dimension of the holes in the patterned holes in the resist. This may cause an electric disturbance due to a misalignment in semiconductor devices that are manufactured by stacking multiple layers in multiple processes with an improved accuracy.

SUMMARY OF THE INVENTION

According to one aspect of the present invention, there is provided a method for manufacturing a semiconductor device. The method comprises: forming a resist layer over a substrate; exposing said resist layer to light thereby to form a first exposed pattern and a second exposed pattern on said resist layer, said second exposed pattern being used for forming one or more trenches; contacting said resist layer with a developing solution thereby to form a patterned resist having an opening corresponding to said first exposed pattern and to form one or more trenches corresponding to said second exposed pattern on a surface layer of said patterned resist; and conducting a bake process on said patterned resist.

According to the present invention, the method includes forming the first and second exposed patterns in the resist layer by the light exposure process, and then contacting the resist layer with the developing solution, thereby forming a patterned resist having an opening and one or more trenches over the surface layer of the patterned resist. Thus, the method prevents thermal shrinkage of the patterned resist when the bake process is performed, thereby providing formation of a desired pattern in the resist.

Namely, the method for manufacturing the semiconductor device is capable of forming trenches in the surface of a resist film (i.e., the patterned resist), thus preventing the thermal shrinkage of the patterned resist when the bake process is performed.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 11A to 11C are cross-sectional views, illustrating a process for manufacturing a semiconductor device in second embodiment according to the present invention;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated.

First Embodiment

Figure 6A:
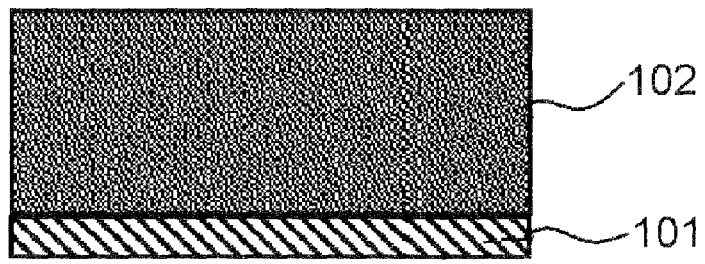
FIGS. 6A to 6D are cross-sectional views, illustrating a process for manufacturing a semiconductor device in first embodiment according to the present invention.
Figure 6B:
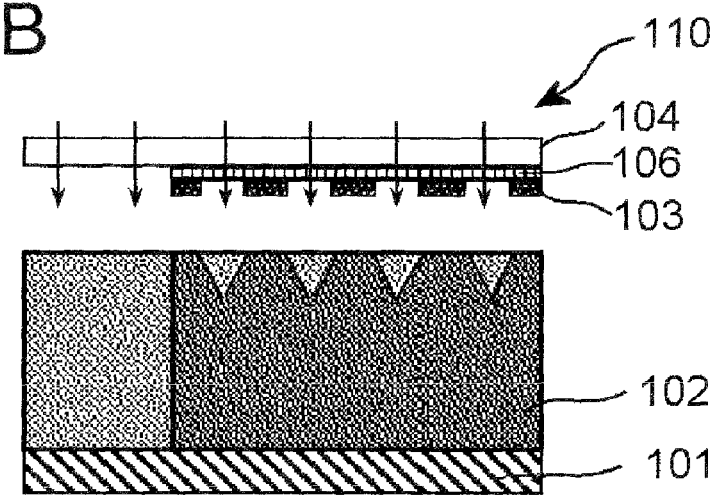
Figure 6C:
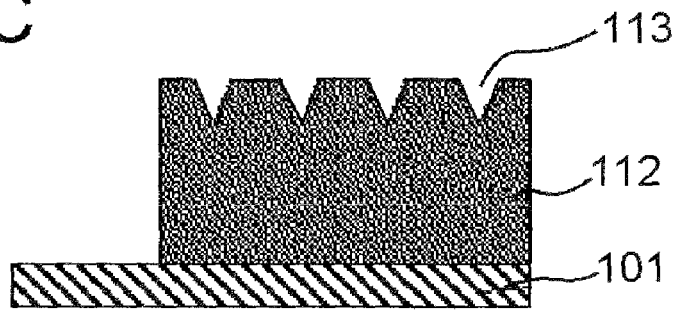
Figure 6D:
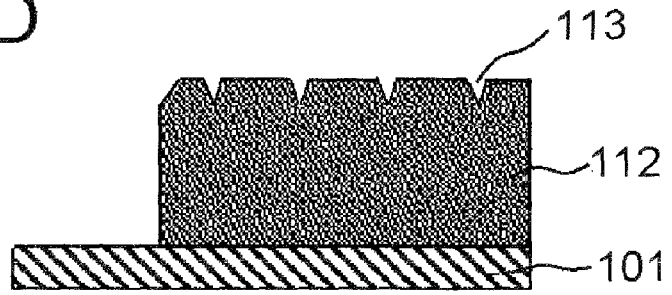

FIGS. 6A to 6D are cross-sectional views, illustrating a process for manufacturing a semiconductor device in the present embodiment according to the present invention. A process for manufacturing a semiconductor device according to the present embodiment includes: forming a resist layer 102 on a substrate 101 (FIG. 6A); exposing the resist layer 102 to light to form exposed regions (first exposed pattern and a second exposed pattern) in the resist layer 102 (FIG. 6B); contacting the resist layer 102 with a developing solution to form a patterned resist 112 having an opening corresponding to the first exposed pattern and to form trenches 113 corresponding to the second exposed pattern, on a surface layer of the patterned resist 112 (FIG. 6C); and conducting a bake process on the patterned resist 112 (FIG. 6D).

Detailed description of respective process operations will be made as follows in reference with exemplary implementations, in which positive resists are employed for the resist layer 102. First of all, a resist is applied over the substrate 101 to form a resist layer 102 (FIG. 6A). While a chemically amplified resist is exemplified for the resist employing here, the available resist is not limited thereto. As shown in FIG. 6B, an exposure process is conducted by using a reticle 110 to form exposed regions (i.e., exposed pattern) on the resist layer 102.

Figure 7:
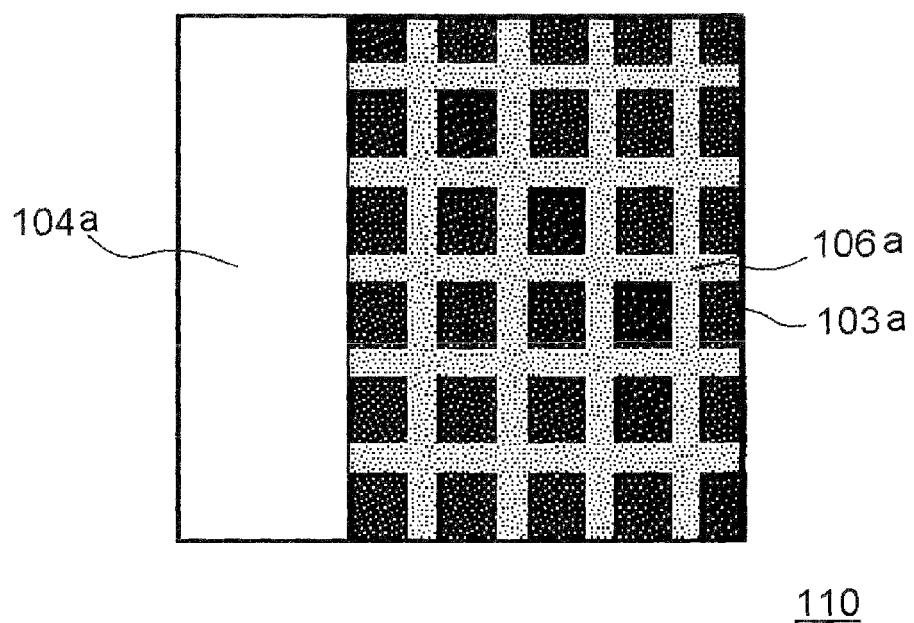
FIG. 7 is a plan view of a reticle.

A plan view of the reticle 110 is shown in FIG. 7. The reticle 110 is provided with transparent portions 104a, light shielding portions 103a and low light transmittance portions 106a exhibiting reduced transmissivity of light for the exposure than the transparent portions. The exposure process conducted by using the reticle 110 provides that the exposed regions (the first and the second exposed patterns) are transferred to the resist layer 102 so that the transparent portion 104a corresponds to an opening formed by removing the resist and the light shielding portions 103a and the low light transmittance portions 106a create the pattern of the resist 112. In addition, the low light transmittance portions 106a are provided so as to correspond to the trenches 113 in the surface layer of the patterned resist 112 by the exposure process. Since a quantity of light passing through the low light transmittance portion 106a is smaller than that passing through the transparent portion 104a, eroded portions of the resist layer 102 form trenches 113 by contacting the resist layer 102 with the developing solution after the exposure.

The low light transmittance portions 106a may be composed of a half-tone film that exhibits a reduced transmissivity for light in the exposure process. A cross-sectional view of the reticle 110 is also shown in FIG. 6B. The reticle 110 is composed of a half-tone film 106 and a light shielding film 103 deposited on a transparent substrate 104 such as a glass substrate.

Here, the half-tone film is employed for the purpose of reducing the transmissivity as compared with the transmissivity of the transparent portion 104a, no particular limitation is required for phases of polarized light, and the same phase or different phases may be utilized. A light shielding chromium film may be employed for the light shielding film 103. Alternatively, another type of half-tone film, which exhibits a transmissivity that is lower than the transmissivity of the half-tone film 106, may also be employed for the light shielding film 103, and thus the light shielding portions 103a may include a laminated structure composed of half-tone films that have different optical transmissivities.

The low light transmittance portion 106a may also be configured of a light shielding film having a plurality of fine slits, each fine slit having a width smaller than the resolution limit for the photolithographic process.

Next, the resist layer 102 is contacted with a developing solution to form the patterned resist 112 and to form the trenches 113 in the surface layer of the patterned resist 112, as shown in FIG. 6C. Here, for the depth D of the trench 113 and the film thickness d of the patterned resist 112, the relative height D/d may be within a range from 1/10 to 1/2.

The width of the trench 113 in the surface of the patterned resist 112 may be sufficient to be equal to or smaller than 10 μm. Further, the trench 113 may be preferably substantially V-shaped in cross sectional view. The term "substantially V-shaped" may extensively include U-shaped for example, and may be sufficient to be a trench geometry having a reduced dimensional area of the bottom of the trench.

A formation of such trenches provides a reduced stress generated in the resist film in the bake process. On the one hand, when a larger trench having larger width of the trench in the surface of the patterned resist 112 and larger width of the bottom of the trench so that the cross-sectional geometry of the trench is rectangular, a stress is expected to be exerted over the bottom of the trench in the resist film according to the dimensional area of the bottom of the trench in the resist film, similarly as in the case of employing the patterned resist without a trench formed therein.

In addition, in a case that an ashing process for removing the patterned resist is additionally conducted, when the width of the trench wider and such that the cross sectional geometry of the trench is rectangular, the ashing is preferentially progressed in the region having trenches formed therein as compared with the region without a trench, and an excessive level of a damage due to the ashing process may be caused over a base film underlying the patterned resist. On the contrary, the substantially V-shaped trench according to the present embodiment can prevent damaging the base layer underlying the patterned resist.

In addition, a plurality of trenches 113 may be preferably provided as shown in FIGS. 6C and 6D. These trenches may be formed in parallel, or may be provided to form a lattice pattern.

Then, a bake process is conducted. As shown in FIG. 6D, no deformation due to the bake process is observed in the patterned resist 112, and therefore a rectangular edge in the cross section of the pattern can be obtained. Conditions for the bake process here may be known conditions, and typical baking temperature may be within a range of from 90 degree C. to 160 degree C.

Figure 8A:
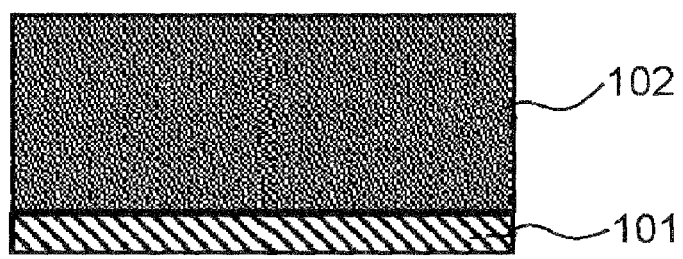
FIGS. 8A to 8D are cross-sectional views, illustrating the process for manufacturing the semiconductor device in first embodiment according to the present invention.
Figure 8B:
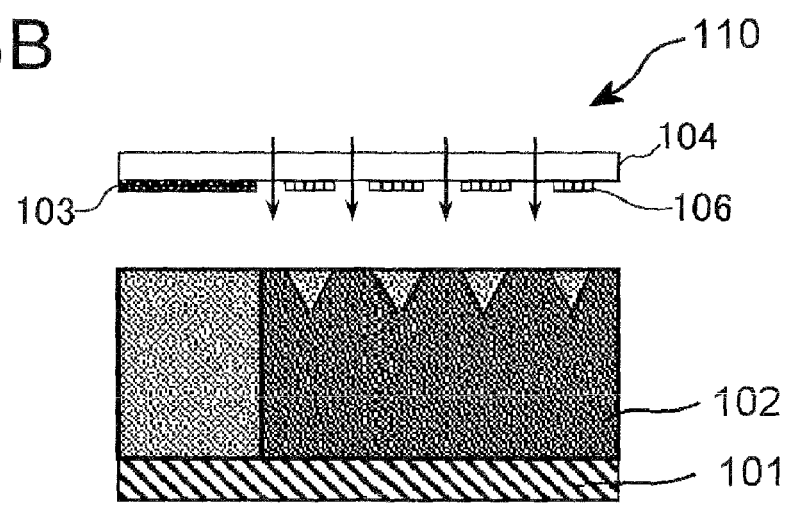
Figure 8C:
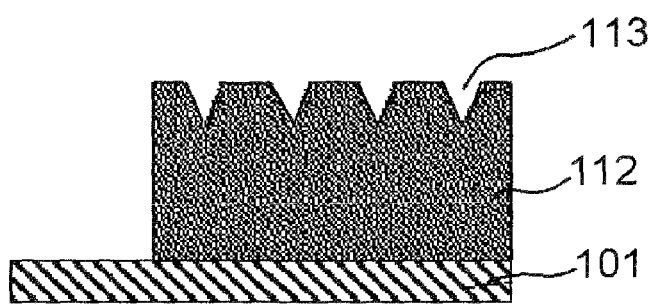
Figure 8D:
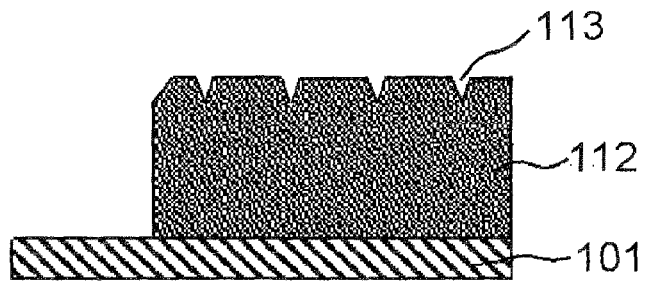
Figure 9:
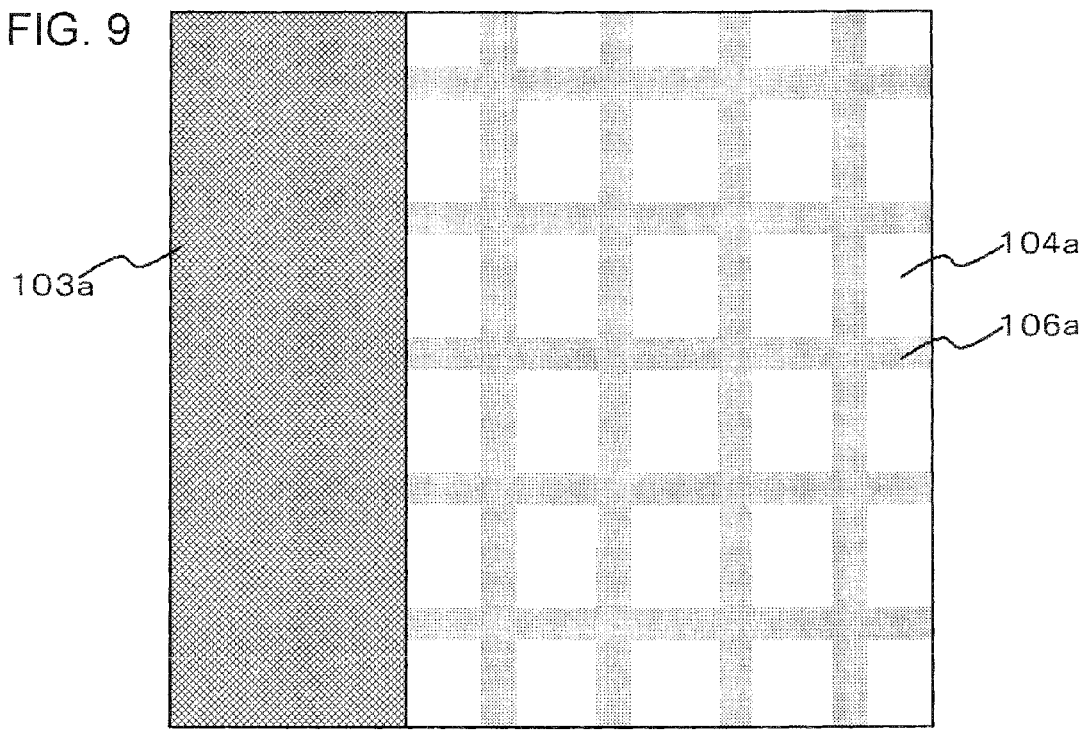
FIG. 9 is a plan view of a reticle.

While the exemplary implementation related to the case employing the positive type resist for the resist layer 102 is described in the above description, a negative type resist may also be employed. FIGS. 8A to 8D show cross-sectional views, illustrating a process for manufacturing the semiconductor device by employing a negative type resist, and FIG. 9 shows a plan view of a reticle 110. Descriptions for the same process operations as employed in the process for manufacturing the semiconductor device in reference to FIG. 6 are not repeated. Configuration of the reticle 110 for the negative resist is different from the reticle for the positive resist.

The reticle 110 is provided with transparent portions 104a, light shielding portions 103a and low light transmittance portions 106a exhibiting reduced transmissivity of light for the exposure than the transparent portions. The exposure process conducted by using the reticle 110 provides that the exposed regions (exposed pattern) are transferred to the resist layer 102 so that the light shielding portion 103a corresponds to an opening formed by removing the resist and the transparent portions 104a and the low light transmittance portions 106a create the pattern of the resist 112. In addition, the low light transmittance portions 106a are provided so as to correspond to the trenches 113 in the surface layer of the patterned resist 112.

Since a quantity of light passing through the low light transmittance portion 106a is smaller than that passing through the transparent portion 104a, eroded portions of the resist layer 102 form trenches 113 by contacting the resist layer 102 with the developing solution after the exposure.

Cross linking reaction of the resin is partially occurred by an exposure to light in use of the negative resist to provide sections of increase molecular weight in the resin, and such sections of increase molecular weight are remained even if the resist is in contact with the developing solution and other sections of the resist are dissolved into the developing solution. The surface of the resist layer 102 is exposed to light transmitted through the low light transmittance portions 106a of the mask. Since the energy of the transmitted light is not sufficient to cause cross linking reaction in all the resin of the whole resist, the trenches can be formed in the resist layer by the contact with the developing solution.

The low light transmittance portions 106a may be composed of a half-tone film that exhibits a reduced transmissivity for light in the exposure process. A cross-sectional view of the reticle 110 is also shown in FIG. 8B. The reticle 110 is composed of a half-tone film 106 and a light shielding film 103 deposited on a transparent substrate 104 such as a glass substrate.

Here, the half-tone film is employed for the purpose of reducing the transmissivity as compared with the transmissivity of the transparent portion 104a, no particular limitation is required for phases of polarized light, and the same phase or different phases may be utilized. A light shielding chromium film may be employed for the light shielding film 103.

Alternatively, the light shielding portion 103a may be configured that a half-tone film is disposed between the light shielding film 103 and the transparent substrate 104. In such case, another type of half-tone film, which exhibits a transmissivity that is lower than the transmissivity of the half-tone film 106, may also be employed for the light shielding film 103, and thus the light shielding portions 103a may include a laminated structure composed of half-tone films that have different optical transmissivities.

Advantageous effects obtainable by employing the manufacturing process for the semiconductor device in the present embodiment will be described as follows. According to the method for manufacturing the semiconductor device in the present embodiment, the exposed regions (first and second exposed patterns) are formed on the resist layer, and the exposed regions are removed in the development process to form the patterned resist having the trenches formed in the surface layer thereof. Therefore, an unwanted thermal shrinkage of the resist film can be prevented in the bake process, thereby providing a desired patterned resist.

The thermal shrinkage of the resist film (patterned resist) due to the bake process is resulted from a shrinking of the polymer resin film constituting the resist film due to the bake process. It is considered that this is caused because of a larger influence of an evaporation of a solvent contained in the polymer resin film for the resist film. In addition, this is also considered to be caused because of influences of a thermal cross linking reaction of the resin or a metamorphic reaction. Thus, the level of the deformation of the polymer resin film is further increased for larger thickness of the polymer resin film, for larger dimensional area of the formed pattern and for higher baking temperature. In addition, when the bake process is conducted at a temperature near the glass transition temperature of the polymer resin, a melting of the resin further cause an increased level of the deformation.

On the one hand, according to the present embodiment, the trenches are formed in the surface layer of the resist film (patterned resist) to provide a corrugated profile in the surface layer of the resist film, so that a deformation of the resist layer due to thermal shrinkage in the resist film in the subsequent bake process can be reduced.

Figure 1A:
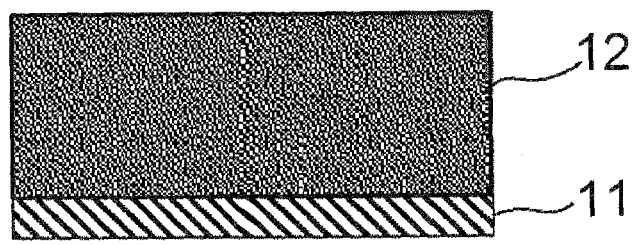
FIGS. 1A to 1D are cross-sectional views, illustrating a conventional process for forming a patterned resist.
Figure 1B:
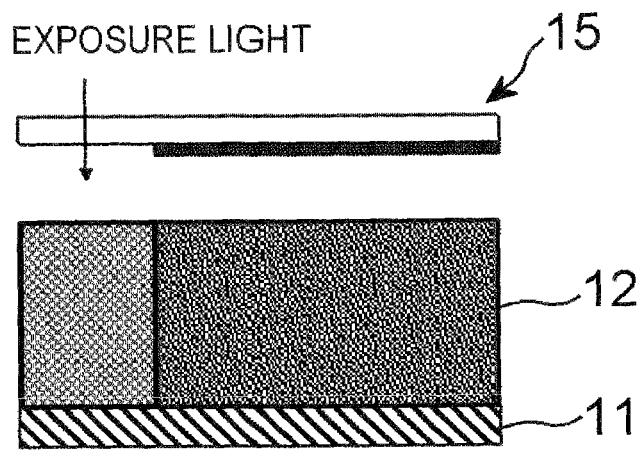
Figure 1C:
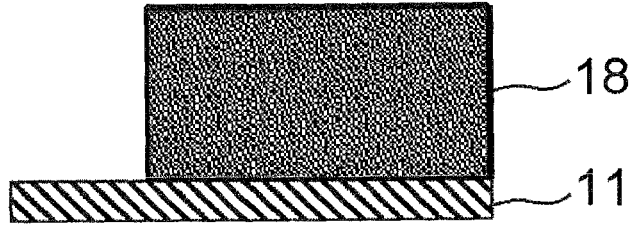
Figure 1D:
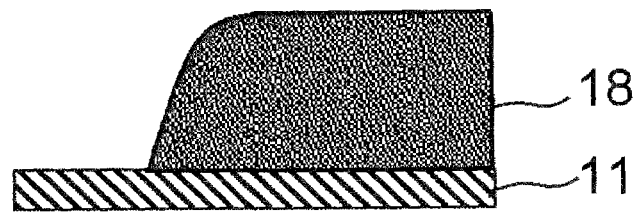
Figure 2A:
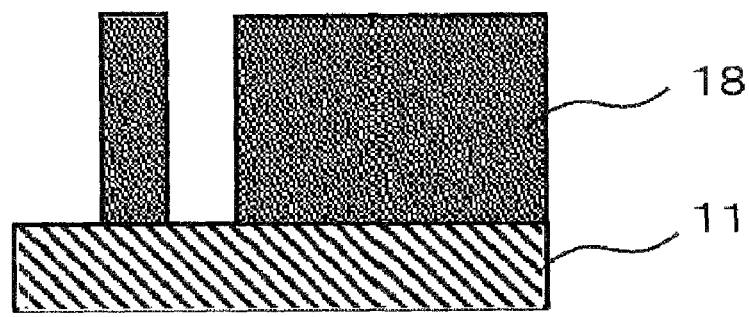
FIGS. 2A to 2C are cross-sectional views, illustrating a conventional process for forming a patterned resist without a geometry change in a bake process.
Figure 2B:
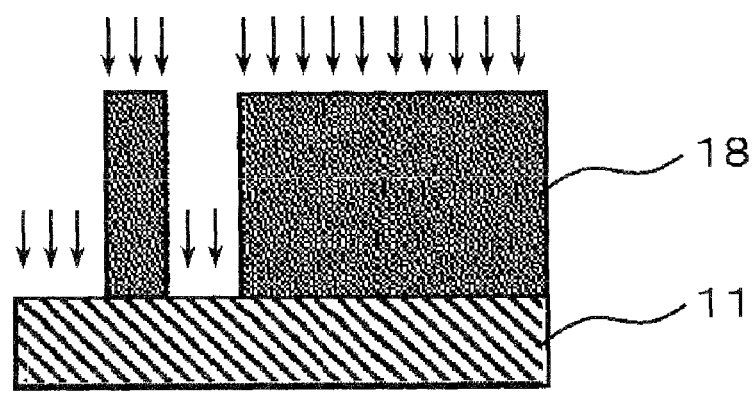
Figure 2C:
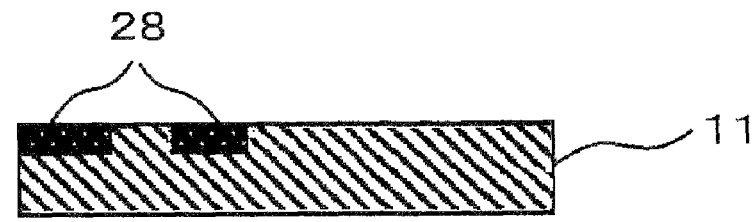
Figure 3A:
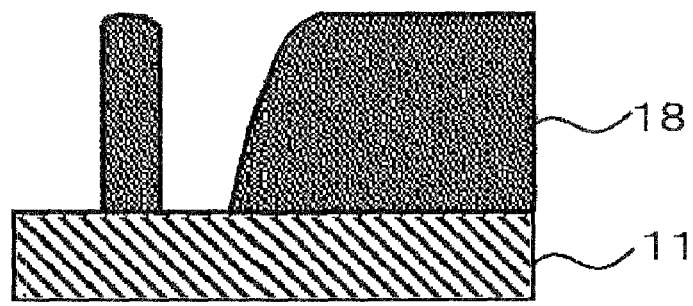
FIGS. 3A to 3C are cross-sectional views, illustrating an example of conducting a conventional ion implanting process on a deformed resist due to the bake process.
Figure 3B:
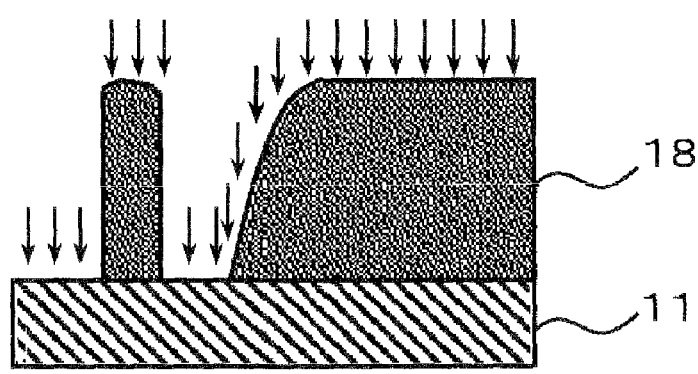
Figure 3C:
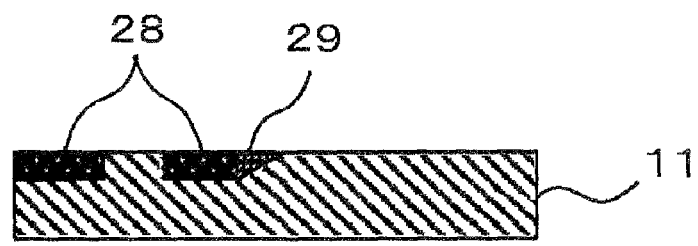
Figure 4A:
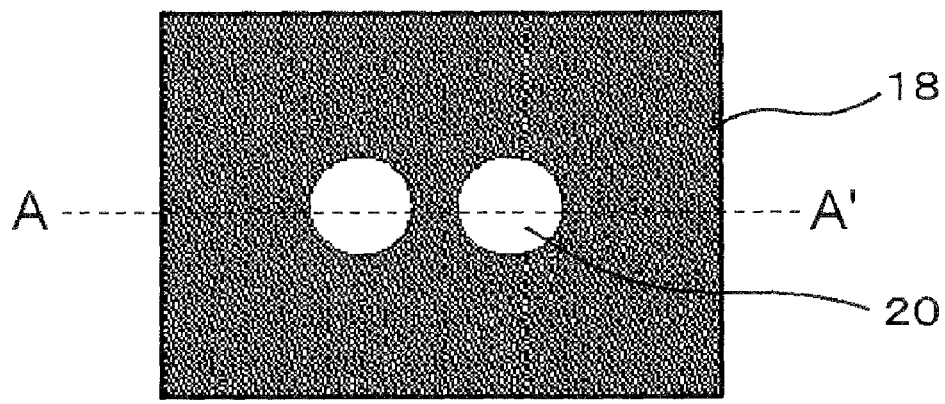
FIGS. 4A to 4C are cross-sectional views, illustrating a conventional process for forming a patterned resist.
Figure 4B:
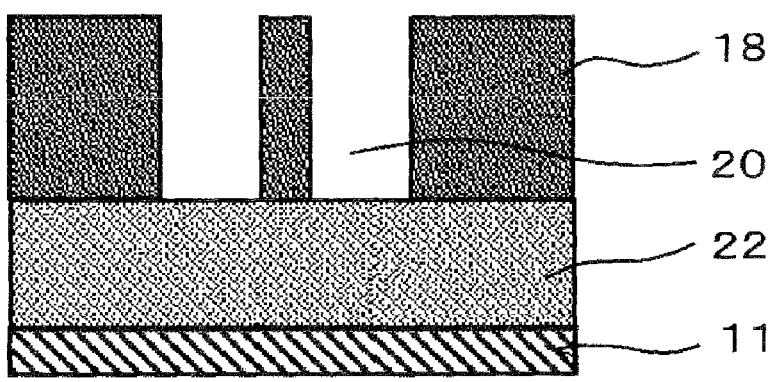
Figure 4C:
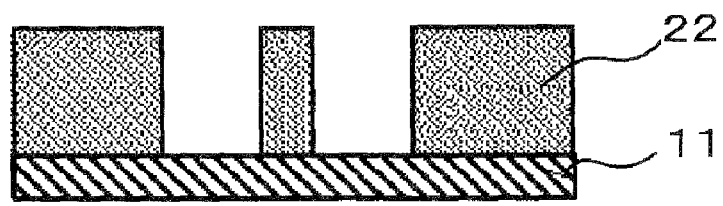
Figure 10A:
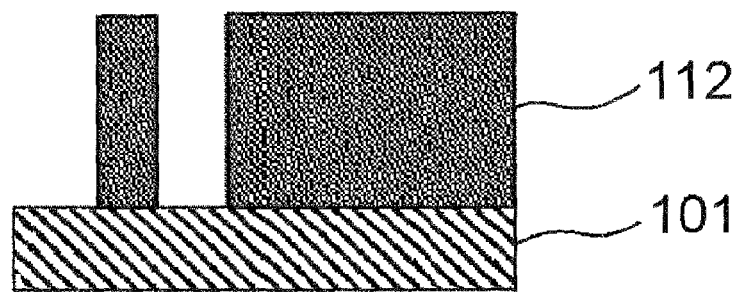
FIGS. 11A to 10C are cross-sectional views, illustrating the process for manufacturing the semiconductor device in first embodiment according to the present invention.
Figure 10B:
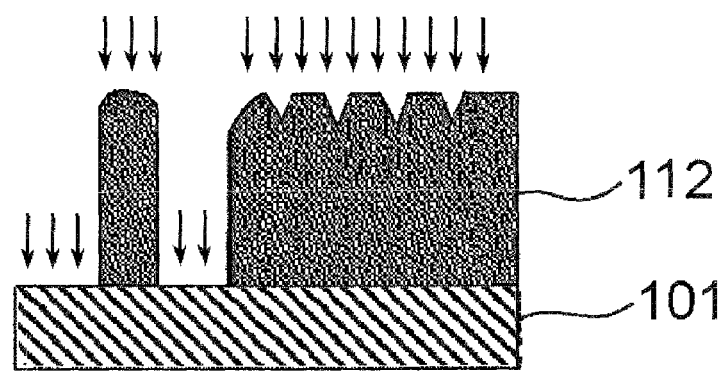
Figure 10C:
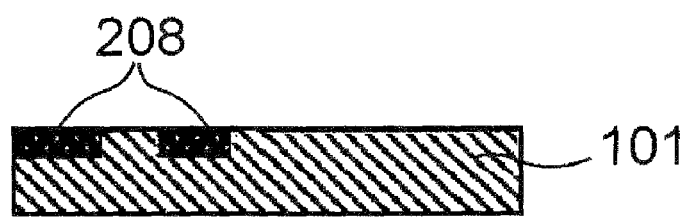

FIGS. 10A to 10C are cross-sectional views, illustrating an ion implantation process carried out through a mask of the patterned resist 112 after the bake process. FIGS. 10A to 10C are cross-sectional views, each illustrating the same process operations as illustrated in FIG. 3A to FIG. 3C for conventional technology, respectively. Since the precise pattern can be provided in the patterned resist 112 by providing an improved geometric stability, which is achieved by providing the trenches in the surface layer of the patterned resist 112 as shown in FIG. 10B, an implanted region A208 that precisely conforms to the pattern of the patterned resist 112 can be ensured in an ion implantation process, as shown in FIG. 10C. This prevents a formation of an unwanted implanted region B29 shown in FIG. 3C.

In addition, according to the present embodiment, the desired pattern for the resist and the low light transmittance portions for providing the trenches are formed in one reticle. Thus, a layout of the trenches can be freely designed on the resist without obstructing flexibility in the design of the pattern.

In addition, the trenches 113 are provided by providing the low light transmittance portions having a reduced optical transmissivity in the reticle, which is lower than the transmissivity of the transparent portions. Thus, an additional photolithographic (exposure) process for providing the trenches 113 is not required. Consequently, multiple steps of three or more steps can be formed on the substrate in one exposure process, and thus an additional process for reducing the deformation of the resist film (patterned resist) due to thermal shrinkage of the resist film in the bake process is not required.

Second Embodiment

The present embodiment describes an exemplary implementation for baking a resist film, which serves as a mask for forming holes via a dry etching process.

Figure 11A:
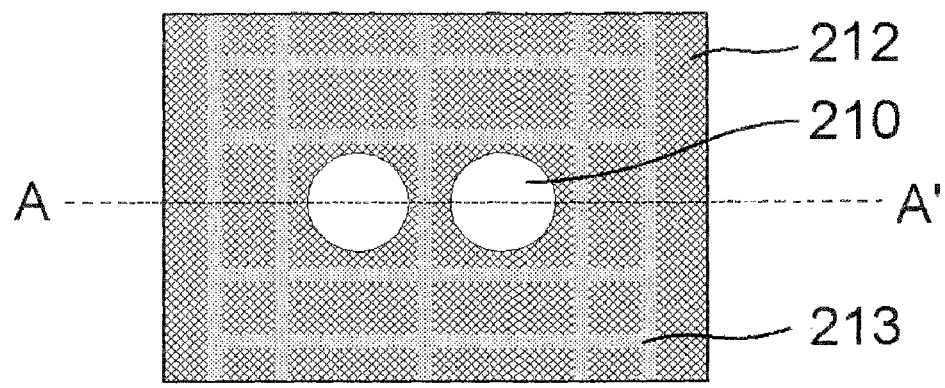
Figure 11B:
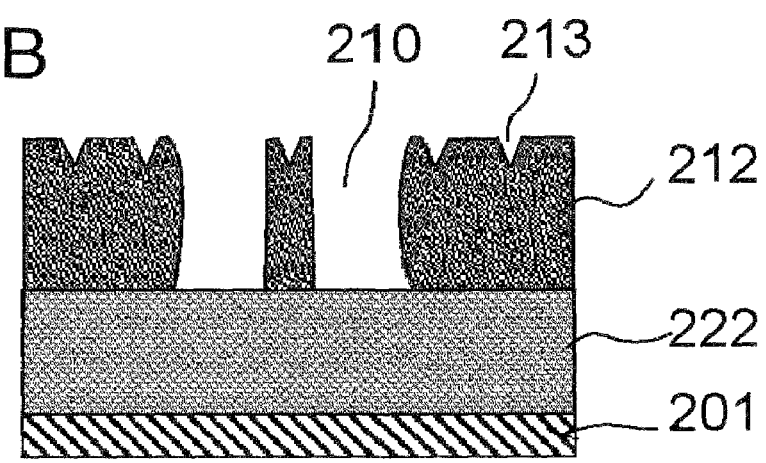
Figure 11C:
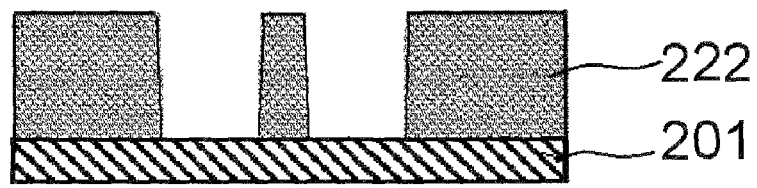

FIGS. 11A to 11C illustrate a process for manufacturing a semiconductor device according to the present embodiment. Basic manufacturing process operations are similar to that of first embodiment, and the descriptions thereof are not repeated here.

FIG. 11A is a plan view of a patterned resist 212 having openings 210 for forming holes, and FIG. 11B is a cross-sectional view along line A-A' of FIG. 11A. An insulating film 222 is deposited on a substrate 201, and a resist is applied over the insulating film 222 to form a resist layer. Next, the resist layer is exposed to light through a reticle to form exposed regions (first and second exposed patterns) on the resist layer, and further a developing process with a developing solution is conducted on the resist layer to obtain a patterned resist 212 having the openings 210 and additionally the trenches 213 in the surface layer thereof, as shown in FIG. 11B. The first exposed pattern corresponds to the openings 210, and the second exposed pattern corresponds to the trenches 213. Here, for the depth D of the trench 213 and the film thickness d of the patterned resist 112, the relative height D/d may be within a range from $1/10$ to $1/2$. Further, a top width of the trench 213 in the surface of the patterned resist 212 may be equal to or lower than $1/2$ of a hole diameter. Further, a cross section of the trench 213 may be preferably substantially V-shaped.

Figure 12:
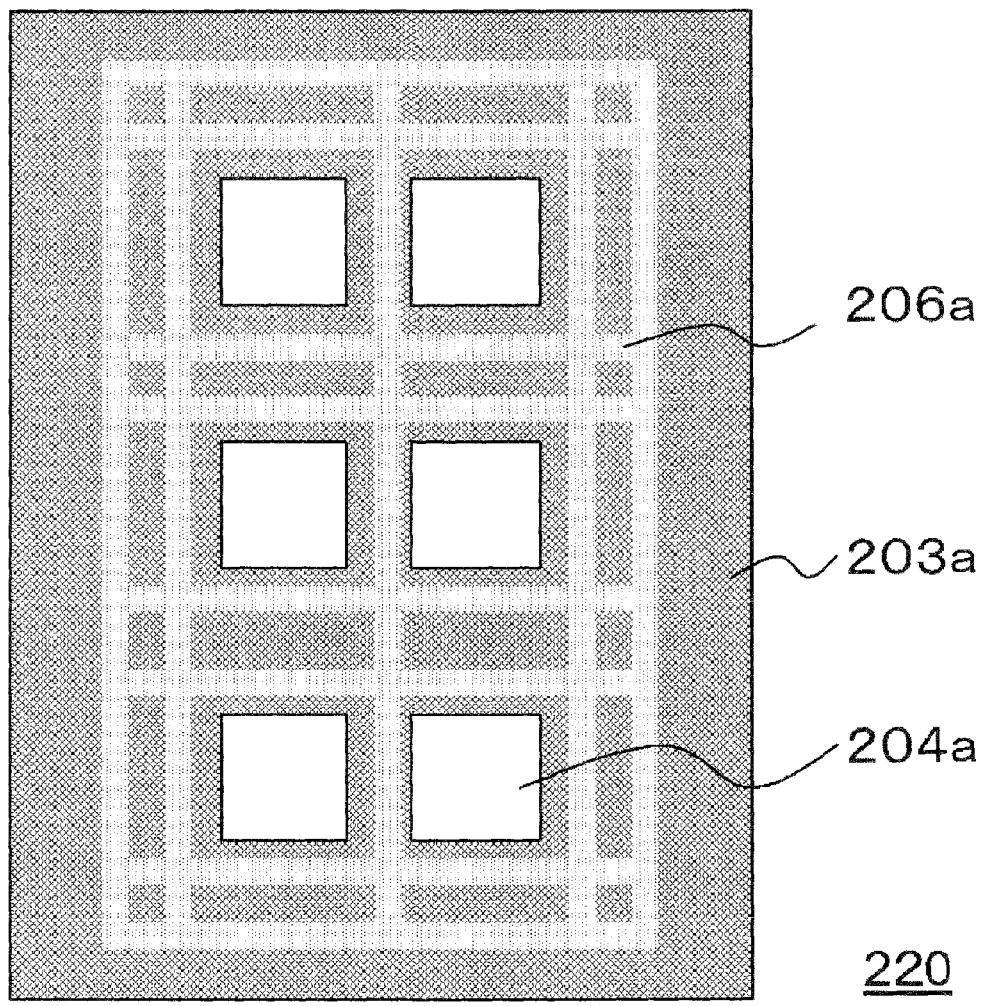
FIG. 12 is a plan view of a reticle.

Next, the insulating film 222 is dry etched through a mask of such patterned resist 212 to form the holes, and then the patterned resist 212 is removed (FIG. 11C). Here, FIG. 12 shows a plan view of a reticle 220 having a pattern for forming holes and a pattern for forming the trenches in the resist film. The description here is related to a reticle for a positive type resist.

The reticle 220 is provided with transparent portions 204a, light shielding portions 203a and low light transmittance portions 206a exhibiting reduced transmissivity of light for the exposure than the transparent portions. The exposure process conducted by using the reticle 220 provides that the exposed regions are transferred to the resist layer so that the transparent portion 204a corresponds to an opening formed by removing the resist and the light shielding portions 203a and the low light transmittance portions 206a create the pattern of the resist 212. In addition, the low light transmittance portions 206a are provided so as to correspond to the trenches 213 in the surface layer of the patterned resist 212 by the exposure process. Since a quantity of light passing through the low light transmittance portion 206a is smaller than that passing through the transparent portion 204a, eroded portions of the resist layer 202 form the trenches 213 by contacting the resist layer 202 with the developing solution after the exposure.

On the contrary, though a reticle for a negative resist is not shown here, such reticle is configured that the transparent portions 204a and the light shielding portions 203a of the reticle 220 are reversed. More specifically, a reticle for a negative resist includes transparent portions, light shielding portions and low light transmittance portions exhibiting reduced optical transmissivity than the transparent portions. The exposure process conducted by using such reticle provides that the exposed regions (first and second exposed patterns) are formed on the resist layer so that the light shielding portions correspond to the openings formed by removing the resist and the transparent portions and the low light transmittance portions create the pattern of the resist 212. In addition, the low light transmittance portions are provided so as to correspond to the trenches 213 in the surface layer of the patterned resist 212 by the exposure process. The light shielding portions are provided for forming the first exposed pattern, and the low light transmittance portions are provided for forming the second exposed pattern.

Here, the low light transmittance portions 206a may be composed of a half-tone film that exhibits a reduced optical transmissivity similarly as in first embodiment.

Here, the half-tone film is employed for the purpose of reducing the transmissivity as compared with the transmissivity of the transparent portion 204a, no particular limitation is required for phases of polarized light, and the same phase or different phases may be utilized. A light shielding chromium film may be employed for the light shielding film 203a. Alternatively, the light shielding portion 203a may include a laminated structure composed of the above-described half-tone film, and another type of half-tone film that exhibits a transmissivity lower than the transmissivity of the above-described half-tone film.

The low light transmittance portions 206a may also be configured of a light shielding film having a plurality of fine slits, each fine slit having a width smaller than the resolution limit for the photolithographic process.

Figure 5A:
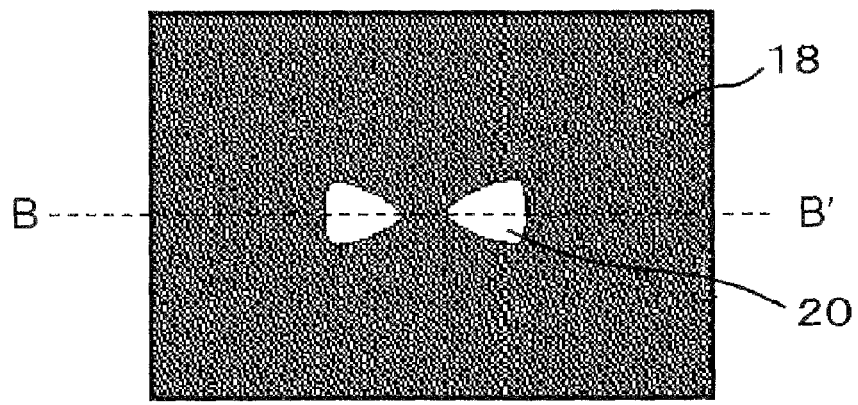
FIGS. 5A to 5C are cross-sectional views, illustrating a conventional process for forming a patterned resist.
Figure 5B:
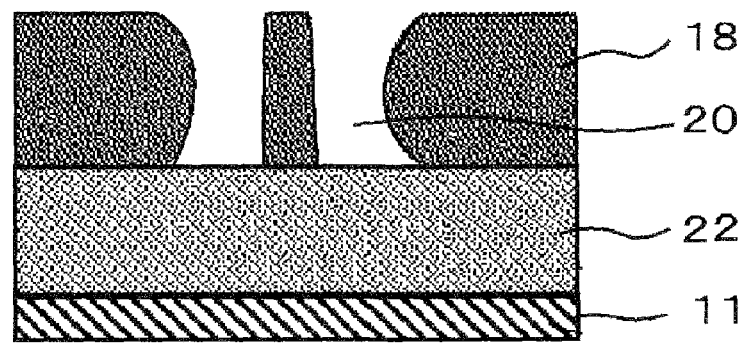
Figure 5C:
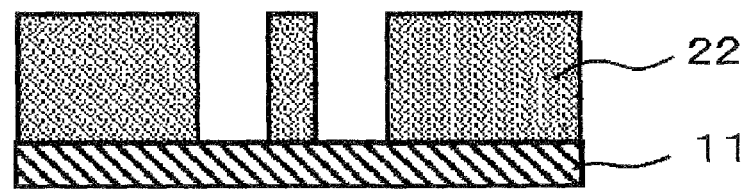

Similar advantageous effects same as obtained in first embodiment are also obtained in the present embodiment. As can be seen in FIGS. 11A and 11B, a deformation of the baking-processed patterned resist 212 is reduced by having the trenches 213 formed thereon, as compared with a patterned resist 18 having no trench formed thereon as shown in FIG. 5B. Thus, the desired geometry of the holes can be provided in the subsequent dry etching process.

A typical example of such desired pattern is shown in a pattern of a reticle 220 of FIG. 12, in which low light transmittance portions 206a for forming trenches can be arranged along the circumferences of the transparent portions 204a that correspond to the opening of the patterned resist with constant intervals, so that a deformation of the resist film (patterned resist) due to the bake process can be prevented and a hole pattern having uniform dimension can be formed. Further, a pattern for forming the trenches can be easily disposed along a circumference of a fine pattern such as hole pattern and the like.

Third Embodiment

Figure 15A:
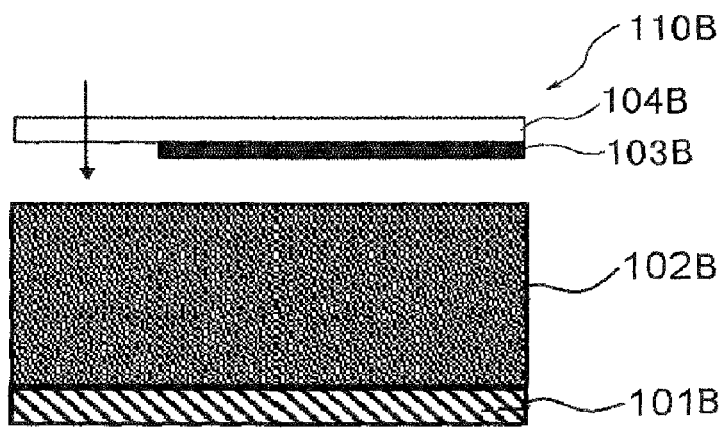
FIGS. 15A to 15D are cross-sectional views, illustrating a process for manufacturing a semiconductor device in third embodiment according to the present invention.
Figure 15B:
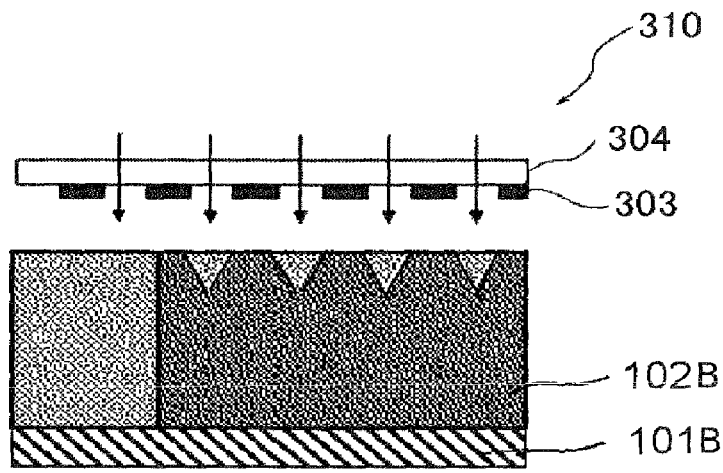
Figure 15C:
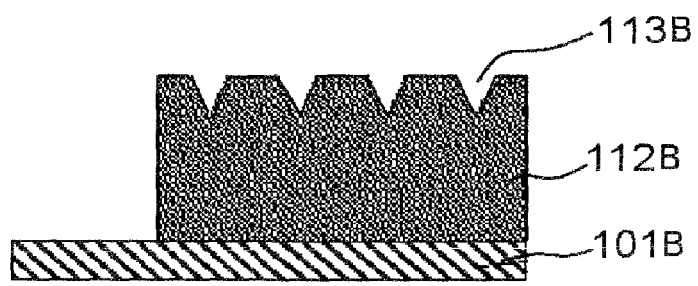
Figure 15D:
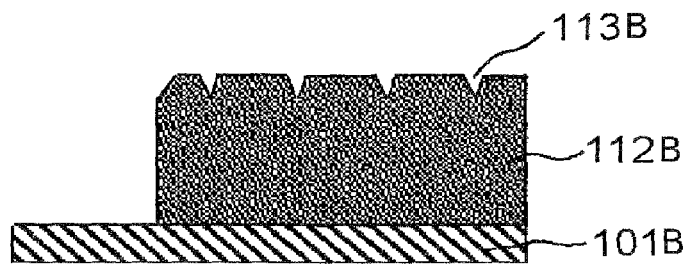

FIGS. 15A to 15D are cross-sectional views, illustrating a process for manufacturing a semiconductor device in the present embodiment. A process for manufacturing a semiconductor device in the present embodiment includes: forming a resist layer 102B on a substrate 101B; forming a predetermined exposed region (first exposed pattern) in the resist layer 102B (FIG. 15A); forming an exposed region for forming trenches (second exposed pattern) in the resist layer 102B (FIG. 15B); contacting the resist layer 102B with a developing solution to form a patterned resist 112B having openings and to form trenches 113B in the surface layer of the patterned resist 112B (FIG. 15C); and conducting a bake process on the patterned resist 112B (FIG. 15D). Here, the sequence for conducting the operation for forming a predetermined exposed region (first exposed pattern) on the resist layer 102B and the operation for forming an exposed region for forming trenches (second exposed pattern) in the resist layer 102B is not particularly limited, and either of these operations may be conducted first. These should be conducted as separated processes, however.

Respective process operations will be described in detail as follows. First of all, a resist material is applied over the substrate 101B to form the resist layer 102B. While a chemically amplified resist is exemplified for the resist employing here, the available resist is not limited thereto. As shown in FIG. 15B, an exposure process is conducted by using a reticle 110B to form predetermined exposed regions (first exposed pattern) on the resist layer 102B. The reticle 110B is composed of a light shielding film 103B deposited on a transparent substrate 104B such as a glass substrate. Next, as shown in FIG. 15B, an exposure process is conducted by using a reticle 310 to form the exposed region for forming trenches (second exposed pattern) on the resist layer 102B. The reticle 310 is composed of a light shielding film 303 deposited on a transparent substrate 304 such as a glass substrate.

Figure 16:
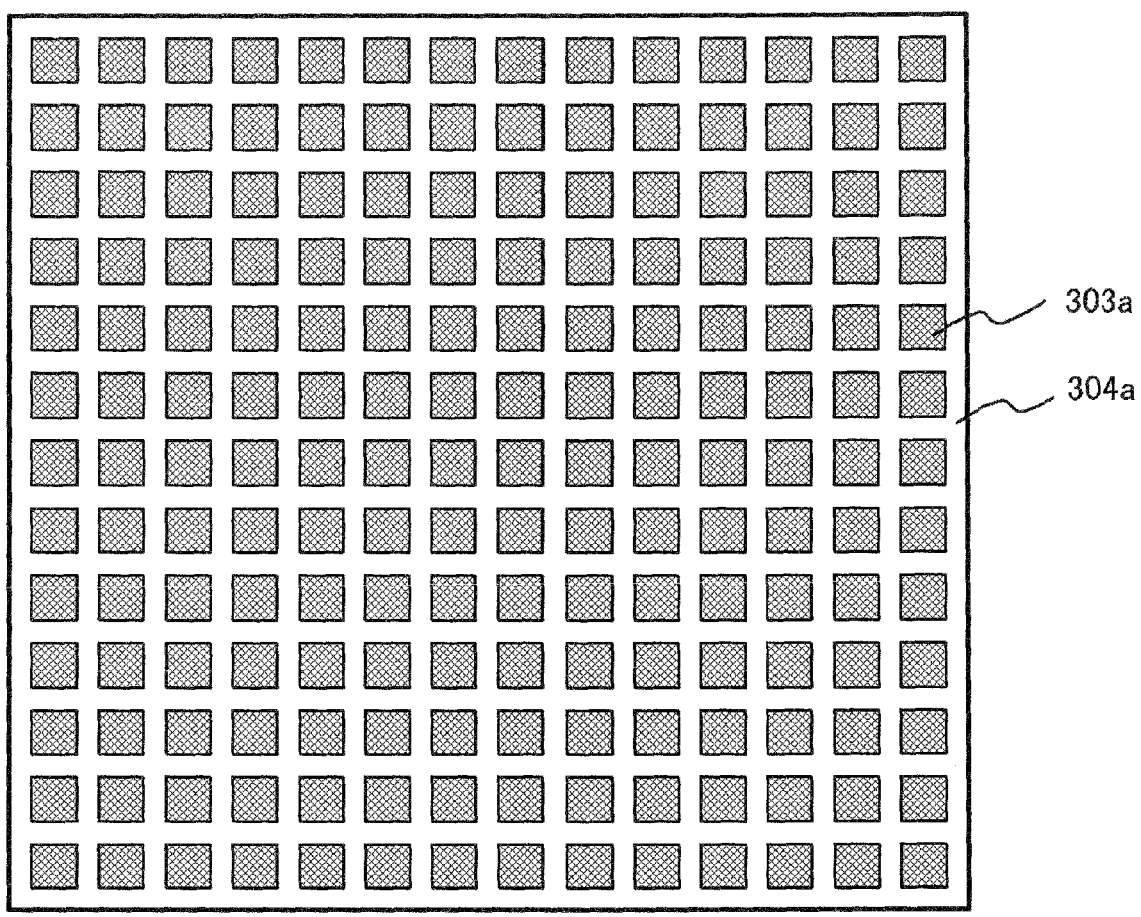
FIG. 16 is a plan view of a reticle.

A plan view of the reticle 310 is shown in FIG. 16. A pattern for forming trenches composed of light shielding portions 303a and transparent portions 304a is provided over the entire surface of the reticle 310. In the reticle 310, the transparent portions 304a are provided so as to correspond to the trenches 113B in the surface layer of the patterned resist 112B by the exposure process.

As shown in FIG. 15B, the exposure process for the resist layer 102B through the reticle 310 may utilize a level of light exposure, which is lower than the level of the light exposure utilized in the exposure process operation for the resist layer 102B in the process for forming the predetermined exposed region (first exposed pattern). For example, such exposure process may preferably utilize an exposure amount, which is equal to or lower than about 50% of the exposure amount in the exposure operation for the resist layer 102B in the process for forming the predetermined exposed region (first exposed pattern). The sufficient amount of light exposure may be the level that provides a completely exposure of sections corresponding to the transparent portions 304a of the resist layer 102B such that no perforation through the film is caused in the patterned resist 112B. The eroded portions of the resist layer 102B form trenches 113B by contacting the resist layer 102B with the developing solution after the exposure. Here, boundary lines shown in FIG. 15B for the resist layer 102B are intended for the purpose of clearly indicating the trenches that are expected be created by the subsequent developing process, and are not intended to represent the surface layer of the resist layer 102B with or without an exposure in relation to the portions corresponding to the trenches.

Further, the reticle 310 may have low light transmittance portions including a half-tone film exhibiting lower transmissivity for the exposure process, in place of the transparent portions 304a. More specifically, the reticle 310 may be configured to a half-tone film and a light shielding film 303 deposited on the transparent substrate 304. In such case, the conditions for the exposure operation in the process for forming the exposed regions for forming the trenches (second exposed pattern) may be selected to be the same as the conditions for the exposure operation in the process for forming the predetermined exposed region (first exposed pattern).

Here, the half-tone film is employed for the purpose of reducing the transmissivity as compared with the transmissivity of the transparent portion 304a, no particular limitation is required for phases of polarized light, and the same phase or different phases may be utilized. A light shielding chromium film may be employed for the light shielding film 303.

Further, the low light transmittance portions may also be configured of a light shielding film having a plurality of fine slits, each fine slit having a width smaller than the resolution limit for the photolithographic process.

Next, the resist layer 102B is contacted with a developing solution to form the patterned resist 112B with the trenches 113B in the surface layer of the patterned resist 112, as shown in FIG. 15C. Here, concerning the depth D of the trench 113B and the film thickness d of the patterned resist 112B, the relative height D/d may be within a range from $1/10$ to $1/2$.

The width of the trench 113B in the surface of the patterned resist may be sufficient to be equal to or smaller than 10 μm.

Further, the trench 113B may be preferably substantially V-shaped in cross sectional view. The term "substantially V-shaped" may extensively include U-shaped for example, and may be sufficient to be a trench geometry having a reduced dimensional area of the bottom of the trench.

A formation of such trenches provides a reduced stress generated in the resist film in the bake process On the one hand, when a larger trench having larger width of the trench in the surface of the patterned resist and larger width of the bottom of the trench so that the cross-sectional geometry of the trench is rectangular, a stress is expected to be exerted over the bottom of the trench in the resist film according to the dimensional area of the bottom of the trench in the resist film, similarly as in the case of employing the patterned resist without a trench formed therein.

In addition, in a case that an ashing process for removing the patterned resist is additionally conducted, when the width of the trench wider and such that the cross sectional geometry of the trench is rectangular, the ashing is preferentially progressed in the region having trenches formed therein as compared with the region without a trench, and an excessive level of a damage due to the ashing process may be caused over a base film underlying the patterned resist. On the contrary, the substantially V-shaped trench according to the present embodiment can prevent damaging the base layer underlying the patterned resist.

In addition, a plurality of trenches 113B may be preferably provided as shown in FIGS. 15C and 15D. These trenches may be formed in parallel, or may be provided to form a lattice pattern.

Then, a bake process is conducted. As shown in FIG. 15D, no deformation due to the bake process is observed in the patterned resist 112B, and therefore a rectangular edge in the cross section of the pattern can be obtained. Conditions for the bake process here may be known conditions, and typical baking temperature may be within a range of from 90 degree C. to 160 degree C.

Advantageous effects obtainable by employing the manufacturing process for the semiconductor device in the present embodiment will be described as follows.

According to the method for manufacturing the semiconductor device in the present embodiment, the exposed regions corresponding to a predetermined pattern (first exposed pattern) are formed on the resist layer, and further the additional exposed regions corresponding to the pattern for forming trenches (second exposed pattern) are formed therein, and then the exposed regions are removed in the development process to form the patterned resist having the trenches formed in the surface layer thereof.

Therefore, an unwanted thermal shrinkage of the resist film can be prevented in the bake process, thereby providing a desired patterned resist.

The thermal shrinkage of the patterned resist due to the bake process is resulted from a shrinking of the polymer resin film constituting the patterned resist due to the bake process.

It is considered that this is caused because of a larger influence of an evaporation of a solvent contained in the polymer resin film for the resist film. In addition, this is also considered to be caused because of influences of a thermal cross linking reaction of the resin or a metamorphic reaction. Thus, the level of the deformation of the polymer resin film is further increased for larger thickness of the polymer resin film, for larger dimensional area of the formed pattern and for higher baking temperature. In addition, when the bake process is conducted at a temperature near the glass transition temperature of the polymer resin, a melting of the resin further cause an increased level of the deformation.

On the one hand, according to the present embodiment, the trenches are formed in the surface layer of the resist film (patterned resist) to provide a corrugated profile in the surface layer of the resist film, so that a deformation of the resist layer due to thermal shrinkage in the resist film in the subsequent bake process can be reduced.

Further, according to the present embodiment, separate exposure processes are conducted for forming the predetermined patterned resist and the pattern for forming trenches by employing different reticles. Thus, the trenches can be formed on the resist without obstructing flexibility in the design of the pattern. Further, the reticle for the pattern for forming the trenches may be employed in combination with the other reticle for forming the predetermined patterned resist, and thus versatility is achieved.

Figure 13:
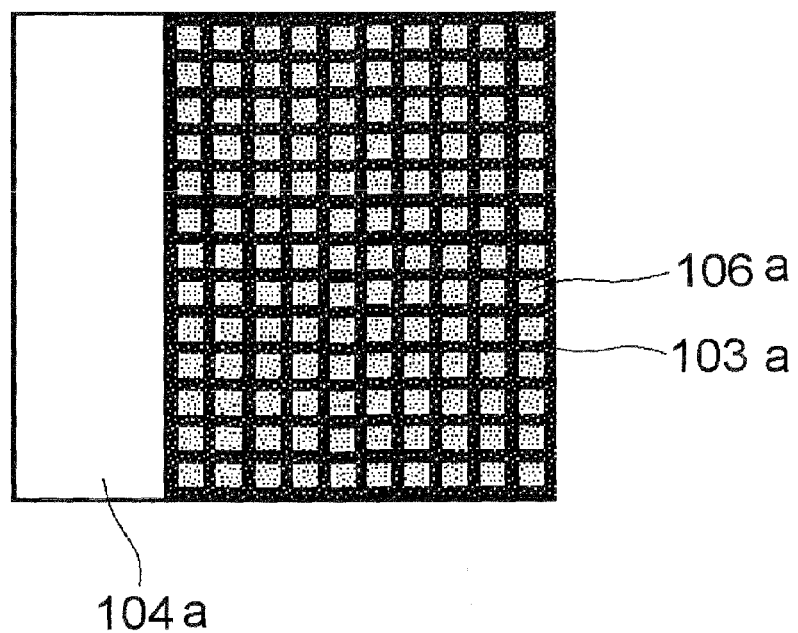
FIG. 13 is a plan view, illustrating a modified embodiment of the reticle.
Figure 14:
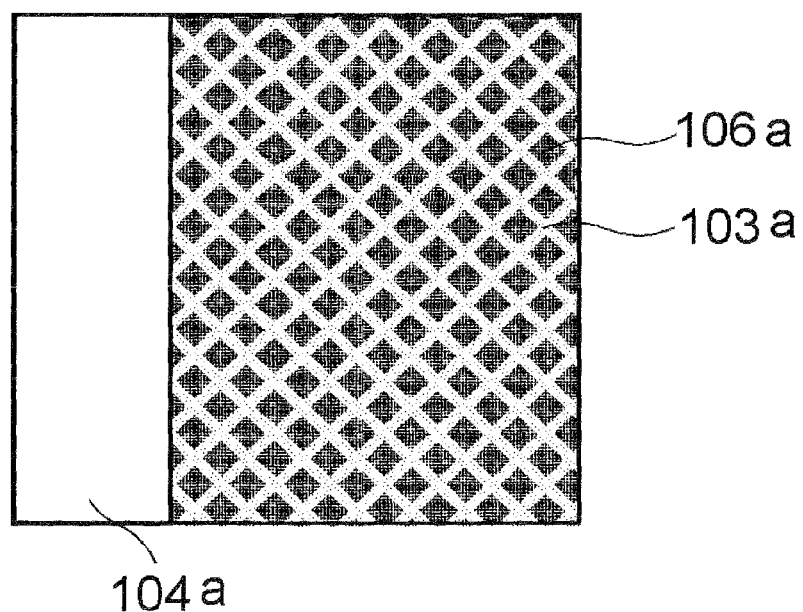
FIG. 14 is a plan view, illustrating a modified embodiment of the reticle.

While the embodiments of the present invention has been fully described in reference to the annexed figures, it is intended to present these embodiments for the purpose of illustrations of the present invention only, and various modifications thereof are also available. For example, in first embodiment, similar advantageous effect may be expected by employing a reticle having a pattern shown in FIG. 13 or FIG. 14, in addition to the reticle having the pattern shown in FIG. 7, and moreover, the available pattern is not particularly limited to the patterns shown here. In addition, while the reticles shown in FIG. 13 and FIG. 14 represent the reticles for the positive type resists, such pattern may be converted to reticles for the negative type resists by converting the transparent portions 104a to light shielding portions and the light shielding portions 103a to transparent portions.

Figure 18:
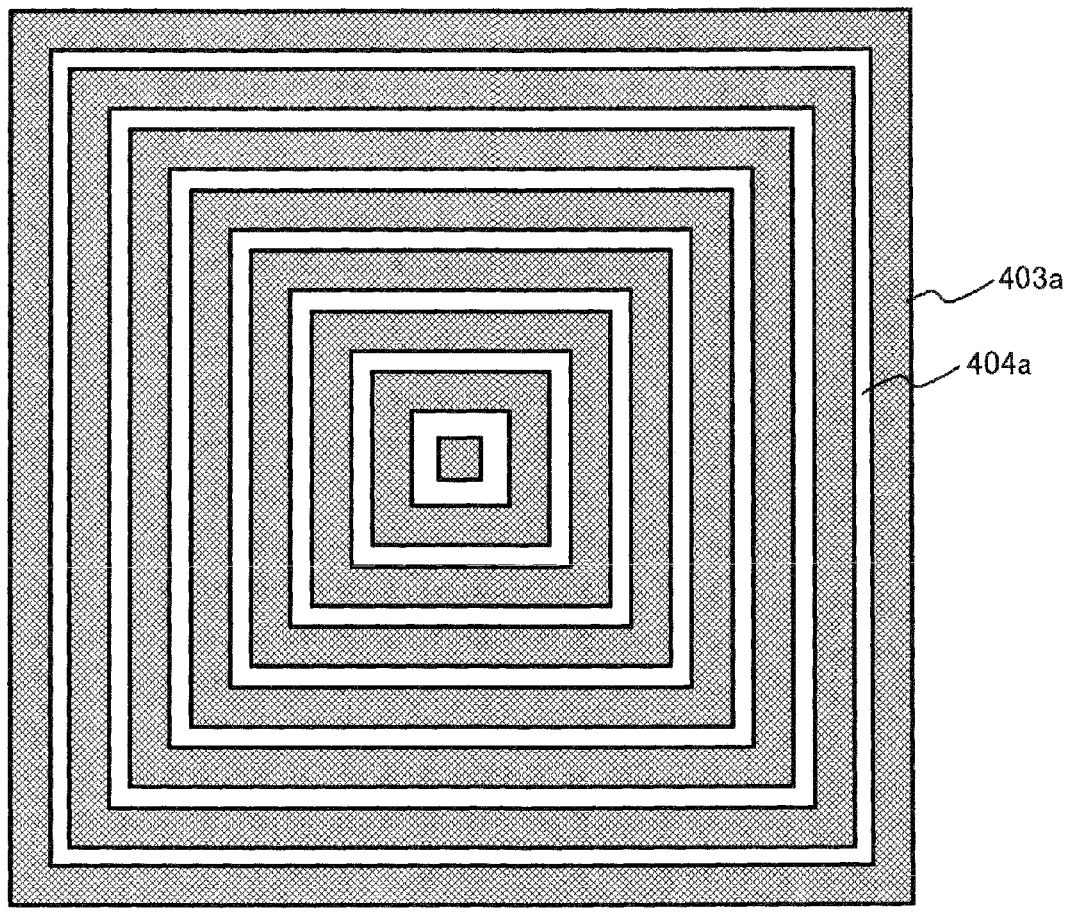
FIG. 18 is a plan view, illustrating a modified embodiment of the reticle.
Figure 19:
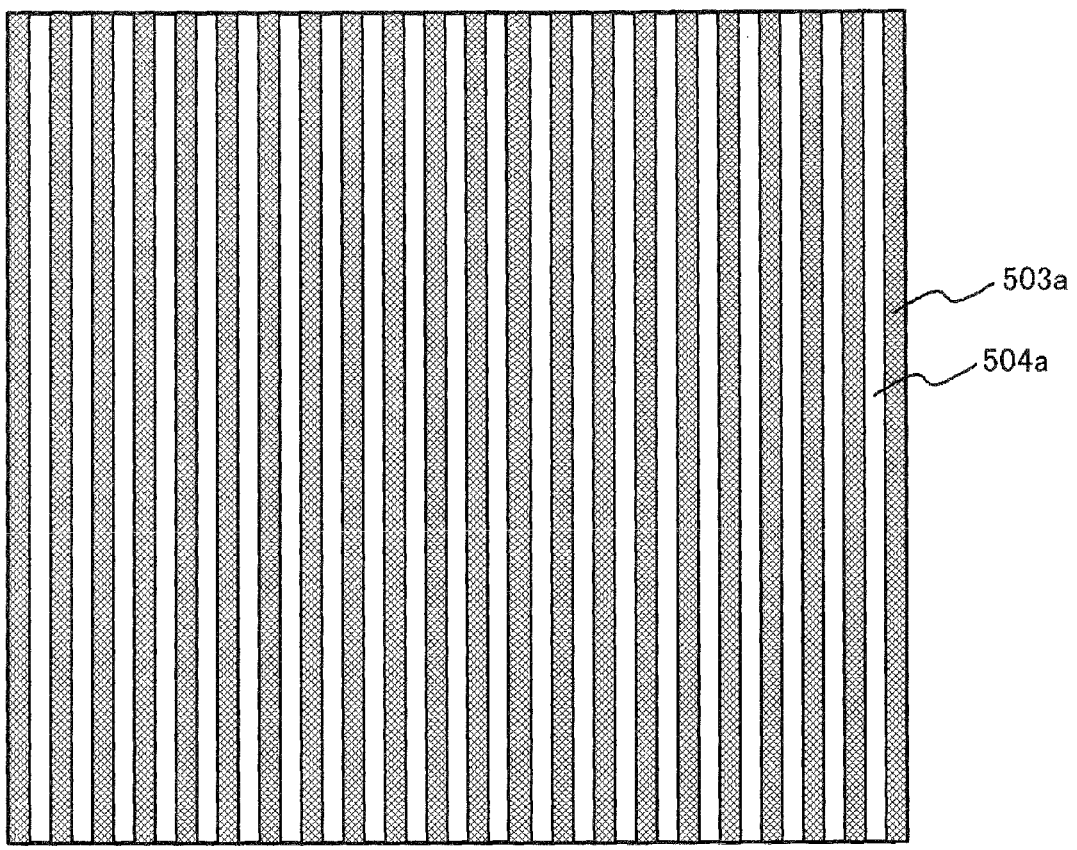
FIG. 19 is a plan view, illustrating a modified embodiment of the reticle.

In third embodiment, similar advantageous effect may be expected by employing a reticle 410 composed of light shielding portions 403a and transparent portions 404a as shown in FIG. 18 or a reticle 510 composed of light shielding portions 503a and transparent portions 504a, in addition to the reticle having the pattern shown in FIG. 16, and moreover, the available pattern is not particularly limited to the patterns shown here. Alternatively, low light transmittance portions composed of a half-tone film may be provided, in place of transparent portions 404a and 504a.

Figure 17A:
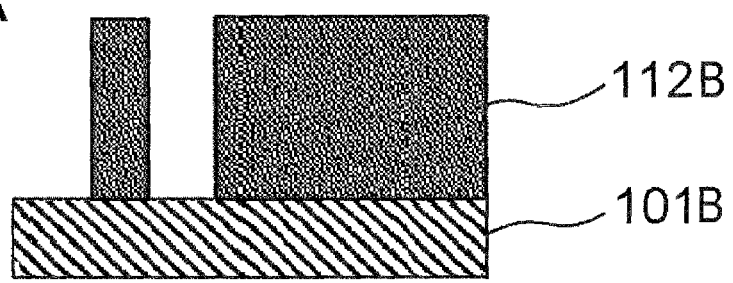
FIGS. 17A to 17C are cross-sectional views, illustrating a process for conducting an ion implanting process through a mask of a baked patterned resist.
Figure 17B:
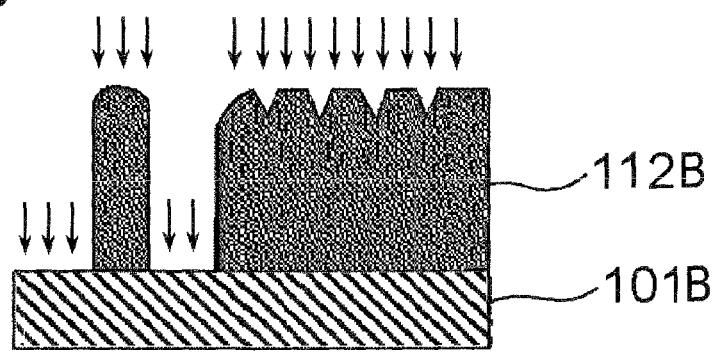
Figure 17C:
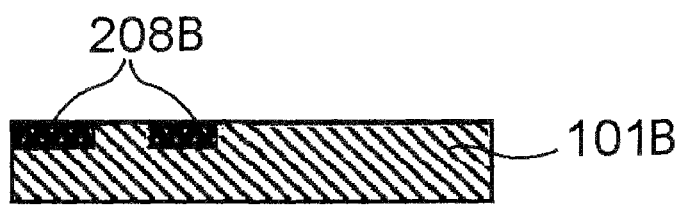

FIGS. 17A to 17C illustrate an ion implantation process conducted by employing a mask of the patterned resist 112B after a bake process. FIGS. 17A to 17C are cross-sectional views corresponding to the respective process operations illustrated in FIGS. 3A to 3C for conventional technology. Since the precise pattern can be provided in the patterned resist 112B by providing an improved geometric stability, which is achieved by providing the trenches in the surface layer of the patterned resist 112B as shown in FIG. 17B, an implanted region A208 that precisely conforms to the pattern of the patterned resist 112B can be ensured in an ion implantation process, as shown in FIG. 17C. This prevents a formation of an unwanted implanted region 29 shown in FIG. 3C.

It is apparent that the present invention is not limited to the above embodiment, and may be modified and changed without departing from the scope and spirit of the invention.

What is claimed is:

1. A method for manufacturing a semiconductor device, comprising:
    forming a resist layer over a substrate;
    exposing said resist layer to light thereby to form a first exposed pattern and a second exposed pattern on said resist layer, said first exposed pattern being adapted to remove the resist layer from the substrate and said second exposed pattern being adapted to form one or more trenches that are in a surface layer of the resist layer spaced from said first exposed pattern and do not extend to the substrate;

contacting said resist layer with a developing solution thereby to remove the resist layer from an opening corresponding to said first exposed pattern to expose the substrate in the opening, and to form said one or more trenches corresponding to said second exposed pattern; and conducting a bake process on said patterned resist.

2. The method for manufacturing the semiconductor device as set forth in claim 1, further comprising a plurality of said one or more trenches that are parallel to each other.

3. The method for manufacturing the semiconductor device as set forth in claim 1, further comprising a plurality of said one or more trenches that form a lattice pattern.

4. The method for manufacturing the semiconductor device as set forth in claim 1, wherein:

said first exposed pattern and said second exposed pattern are formed by exposing said resist layer using a reticle, said reticle having a transparent portion, a light shielding portion, and a low light transmittance portion which has an optical transmissivity of light to which said resist layer is exposed lower than that of said transparent portion; and said transparent portion corresponds to said opening, said light shielding portion and said low light transmittance portion correspond to said second exposed pattern, and said low light transmittance portion corresponds to said one or more trenches.

5. The method for manufacturing the semiconductor device as set forth in claim 4, wherein said low light transmittance portion of said reticle includes a half-tone film.

6. The method for manufacturing the semiconductor device as set forth in claim 5, wherein said light shielding portion of said reticle includes a laminated structure composed of said half-tone film and another type of half-tone film having an optical transmissivity that is lower than an optical transmissivity of said half-tone film.

7. The method for manufacturing the semiconductor device as set forth in claim 4, wherein said low light transmittance portion of said reticle includes a light shielding film having a plurality of fine slits, each fine slit having a width smaller than a resolution limit for a photolithographic process.

8. The method for manufacturing the semiconductor device as set forth in claim 1, wherein:

said first exposed pattern and said second exposed pattern are formed by exposing said resist layer using a reticle having a transparent portion, a light shielding portion, and a low light transmittance portion, an optical transmissivity of said low light transmittance portion for light employed in the exposure for said resist layer being lower than that of said transparent portion; and said light shielding portion corresponds to said opening, said transparent portion and said low light transmittance portion correspond to said second exposed pattern, and said low light transmittance portion corresponds to said one or more trenches in said surface layer.

9. The method for manufacturing the semiconductor device as set forth in claim 8, wherein said low light transmittance portion of said reticle contains a half-tone film.

10. The method for manufacturing the semiconductor device as set forth in claim 9, wherein said light shielding portion of said reticle includes a laminated structure composed of said half-tone film and another type of half-tone film that has an optical transmissivity lower than an optical transmissivity of said half-tone film.

11. The method for manufacturing the semiconductor device as set forth in claim 9, wherein said low light transmittance portion of said reticle includes a light shielding film having a plurality of fine slits, each fine slit having a width smaller than a resolution limit for a photolithographic process.

12. The method for manufacturing the semiconductor device as set forth in claim 1, wherein said step of exposing the resist layer to light to form a first exposed pattern and a second exposed pattern includes:

forming said first exposed pattern on said resist layer by exposing said resist layer; and forming said second exposed pattern on said resist layer by exposing said resist layer.

13. The method for manufacturing the semiconductor device as set forth in claim 12, wherein said step of forming said second exposed pattern is performed by using a reticle which has a pattern for forming said one or more trenches in an entire surface of the reticle.

14. The method for manufacturing the semiconductor device as set forth in claim 12, wherein:

said reticle used in said step of forming the second exposed pattern includes a light shielding portion and a transparent portion; and an amount of light to which said resist layer is exposed in said step of forming the first exposed pattern is smaller than an amount of light to which said resist layer is exposed in said step of forming the second exposed pattern.

15. The method for manufacturing the semiconductor device as set forth in claim 12, wherein:

said reticle used in said step of forming the second exposed pattern includes a light shielding portion and a low light transmittance portion; and said low light transmittance portion includes a half-tone film.

16. The method for manufacturing the semiconductor device as set forth in claim 12, wherein:

said reticle used in said step of forming the second exposed pattern includes a light shielding portion and a low light transmittance portion; and said low light transmittance portion includes a light shielding film having a plurality of fine slits, each fine slit having a width smaller than a resolution limit for a photolithographic process.

17. The method for manufacturing the semiconductor device as set forth in claim 1, wherein D/d representing a relative height is within a range from $1/10$ to $1/2$, where D denotes a depth of said one or more trenches and d denotes a thickness of said resist layer.

18. The method for manufacturing the semiconductor device as set forth in claim 1, wherein a width of each of said one or more trenches is more than zero and not greater than 10 µm.

19. The method for manufacturing the semiconductor device as set forth in claim 1, wherein each of said one or more trenches has a substantially V-shaped cross section.

* * * * *